(12) United States Patent
Wu et al.

(10) Patent No.: US 9,979,145 B2
(45) Date of Patent: May 22, 2018

(54) CABLE HAVING IMPROVED ARRANGEMENT OF POWER WIRES

(71) Applicant: FOXCONN INTERCONNECT TECHNOLOGY LIMITED, Grand Cayman (KY)

(72) Inventors: Jerry Wu, Irvine, CA (US); Jun Chen, Kunshan (CN); Fan-Bo Meng, Kunshan (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days. days.

(21) Appl. No.: 15/408,752

(22) Filed: Jan. 18, 2017

(65) Prior Publication Data

US 2017/0207589 A1    Jul. 20, 2017

(30) Foreign Application Priority Data

Jan. 19, 2016  (CN) .......................... 2016 1 0032958

(51) Int. Cl.
| H01B 9/02 | (2006.01) |
| H01R 24/60 | (2011.01) |
| H05K 1/11 | (2006.01) |
| H01R 12/53 | (2011.01) |
| H01R 13/6471 | (2011.01) |
| H01R 13/6591 | (2011.01) |

(52) U.S. Cl.
CPC ............ *H01R 24/60* (2013.01); *H01R 12/53* (2013.01); *H01R 13/6471* (2013.01); *H01R 13/6591* (2013.01); *H05K 1/111* (2013.01); *H05K 2201/09409* (2013.01); *H05K 2201/10189* (2013.01)

(58) Field of Classification Search
CPC .. H05K 1/0245; H05K 1/111; H01R 2107/00; H01R 12/53; H01R 4/02; H01R 24/60; H01B 11/12; H01B 11/002
USPC ............................ 439/108, 581, 620.21, 676
See application file for complete search history.

(56) References Cited

U.S. PATENT DOCUMENTS 6,368,155 B1 *   4/2002   Bassler .............. H01R 13/6616
                                                              340/650
6,674,010 B2 *   1/2004   Inui ........................ H01B 11/06
                                                              174/113 C (Continued)

FOREIGN PATENT DOCUMENTS

| CN | 202422804 | 9/2012 |
| CN | 203013336 | 6/2013 |

*Primary Examiner* — Abdullah Riyami
*Assistant Examiner* — Nelson R Burgos-Guntin
(74) *Attorney, Agent, or Firm* — Wei Te Chung; Ming Chieh Chang

(57) ABSTRACT

A cable includes: plural wires including plural pairs of differential signal wires, a detection signal wire, at least one auxiliary signal wire, a plurality of low speed signal wires, and two power wires arranged adjacent to the low speed signal wires; and a jacket enclosing the plurality of wires; wherein the differential signal wires, the detection signal wire, and the at least one auxiliary signal wire are arranged at an outer periphery of and enclosing the low speed signal wires and the two power wires, and every two adjacent differential signal wire pairs are separated by one of the detection signal wire and the at least one auxiliary signal wire.

9 Claims, 9 Drawing Sheets

(56) References Cited

U.S. PATENT DOCUMENTS

| | | | | |
|---|---|---|---|---|
| 7,304,241 B2* | 12/2007 | Trieb | H01R 9/032 | |
| | | | 174/74 R | |
| 7,918,685 B1* | 4/2011 | Kruckenberg | H01B 11/00 | |
| | | | 174/75 C | |
| 8,546,690 B2* | 10/2013 | Masakazu | H01B 11/002 | |
| | | | 174/103 | |
| 9,244,240 B2* | 1/2016 | Hayashishita | G02B 6/4434 | |
| 9,293,876 B2* | 3/2016 | Terlizzi | H01R 29/00 | |
| 9,508,467 B2* | 11/2016 | Pon | H01B 9/003 | |
| 9,520,673 B2* | 12/2016 | Xing | H01R 13/5845 | |
| 9,607,738 B1* | 3/2017 | Wu | H01B 11/20 | |
| 9,634,409 B2* | 4/2017 | Tsai | H01R 12/716 | |
| 9,667,007 B2* | 5/2017 | Terlizzi | H01R 29/00 | |
| 2003/0121694 A1* | 7/2003 | Grogl | H01B 3/441 | |
| | | | 174/113 R | |
| 2004/0121633 A1* | 6/2004 | David | H01R 13/6477 | |
| | | | 439/108 | |
| 2009/0104813 A1* | 4/2009 | Chen | H01R 9/038 | |
| | | | 439/581 | |
| 2010/0051318 A1* | 3/2010 | Wang | H01B 11/12 | |
| | | | 174/113 R | |
| 2010/0084157 A1* | 4/2010 | Wang | H01B 11/12 | |
| | | | 174/107 | |
| 2010/0258333 A1* | 10/2010 | Horan | H01B 11/1091 | |
| | | | 174/78 | |
| 2011/0278043 A1* | 11/2011 | Ueda | H01B 7/1895 | |
| | | | 174/115 | |
| 2012/0103651 A1* | 5/2012 | Kim | H01B 11/1808 | |
| | | | 174/102 R | |
| 2012/0227996 A1 | 9/2012 | Ardisana, II et al. | | |
| 2013/0115817 A1* | 5/2013 | Terlizzi | H01R 13/6683 | |
| | | | 439/620.21 | |
| 2013/0115821 A1* | 5/2013 | Golko | H01R 13/516 | |
| | | | 439/638 | |
| 2013/0122754 A1* | 5/2013 | Golko | H01R 13/516 | |
| | | | 439/676 | |
| 2013/0264091 A1 | 10/2013 | Watanabe | | |
| 2014/0075069 A1* | 3/2014 | Mullins | H04M 1/0274 | |
| | | | 710/106 | |
| 2014/0305675 A1 | 10/2014 | Liang et al. | | |
| 2015/0340814 A1* | 11/2015 | Jaussi | H01R 13/6461 | |
| | | | 439/39 | |
| 2016/0079689 A1* | 3/2016 | Wu | B23K 1/0016 | |
| | | | 439/581 | |
| 2016/0079714 A1* | 3/2016 | Wu | H01R 13/6585 | |
| | | | 439/607.05 | |
| 2017/0040749 A1* | 2/2017 | Tsai | H01R 13/6587 | |

* cited by examiner

CABLE HAVING IMPROVED ARRANGEMENT OF POWER WIRES

CROSS-REFERENCE TO RELATED APPLICATIONS

This patent application relates to a U.S. patent application Ser. No. 15/296,264, filed on Oct. 18, 2016, entitled "CABLE HAVING IMPROVED ANTI CROSS TALK PERFORMANCE," which is assigned to the same assignee as this application.

BACKGROUND OF THE INVENTION

1. Field of the Invention

The present invention relates to a cable having improved arrangement of power wires for transmission of large current.

2. Description of Related Arts

USB Type-C Cable and Connector Specification Revision 1.0, published on Aug. 11, 2014, illustrates a high speed cable comprising a plurality of first wires (for USB 2.0 signaling, SBU1, SBU2, CC, power return, and Vconn), an inner shielding layer enclosing the first wires, a plurality of coaxial wires (differential pairs) for high speed signaling arranged at an outer side of the inner shielding, and a power wire disposed between the coaxial wires. U.S. Patent Application Publication No. 2016/0079714, published on Mar. 17, 2016, discloses a cable comprising a plurality of coaxial wires having a similar structure as the high speed cable of the USB Type-C Cable Specification Revision 1.0.

U.S. Pat. No. 9,244,240, issued on Jan. 26, 2016, discloses a cable comprising a plurality of coaxial wires for high speed transmission and a plurality of insulated wires for power supply or low speed signal.

SUMMARY OF THE INVENTION

A cable comprises: a plurality of wires including a plurality of differential signal wires in pairs for transmitting high speed signal, a detection signal wire, at least one auxiliary signal wire, a plurality of low speed signal wires, and two power wires arranged adjacent to the low speed signal wires; and a jacket enclosing the plurality of wires; wherein the plurality of differential signal wires, the detection signal wire, and the at least one auxiliary signal wire are arranged at an outer periphery of and enclosing the low speed signal wires and the two power wires, and every two adjacent differential signal wire pairs are separated by one of the detection signal wire and the at least one auxiliary signal wire. The addition of one more power wire is accompanied by removal of an otherwise needed ground for power return.

DETAILED DESCRIPTION OF THE PREFERRED EMBODIMENT

Figure 1:
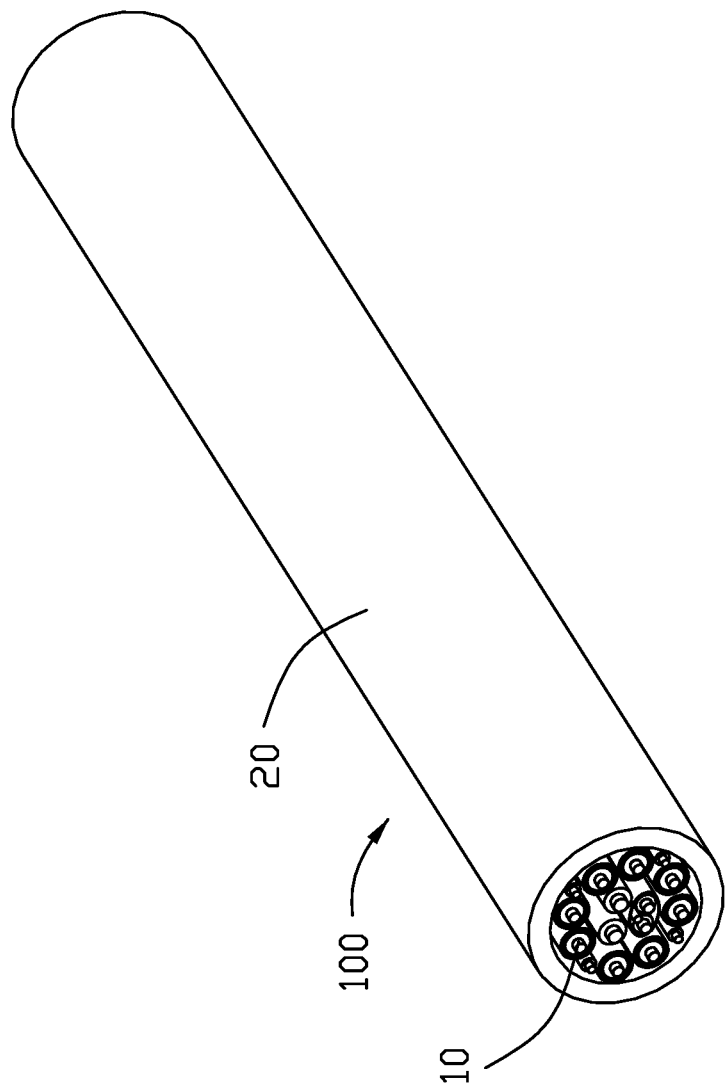
FIG. 1 is a perspective view of a cable in accordance with the present invention.
Figure 2:
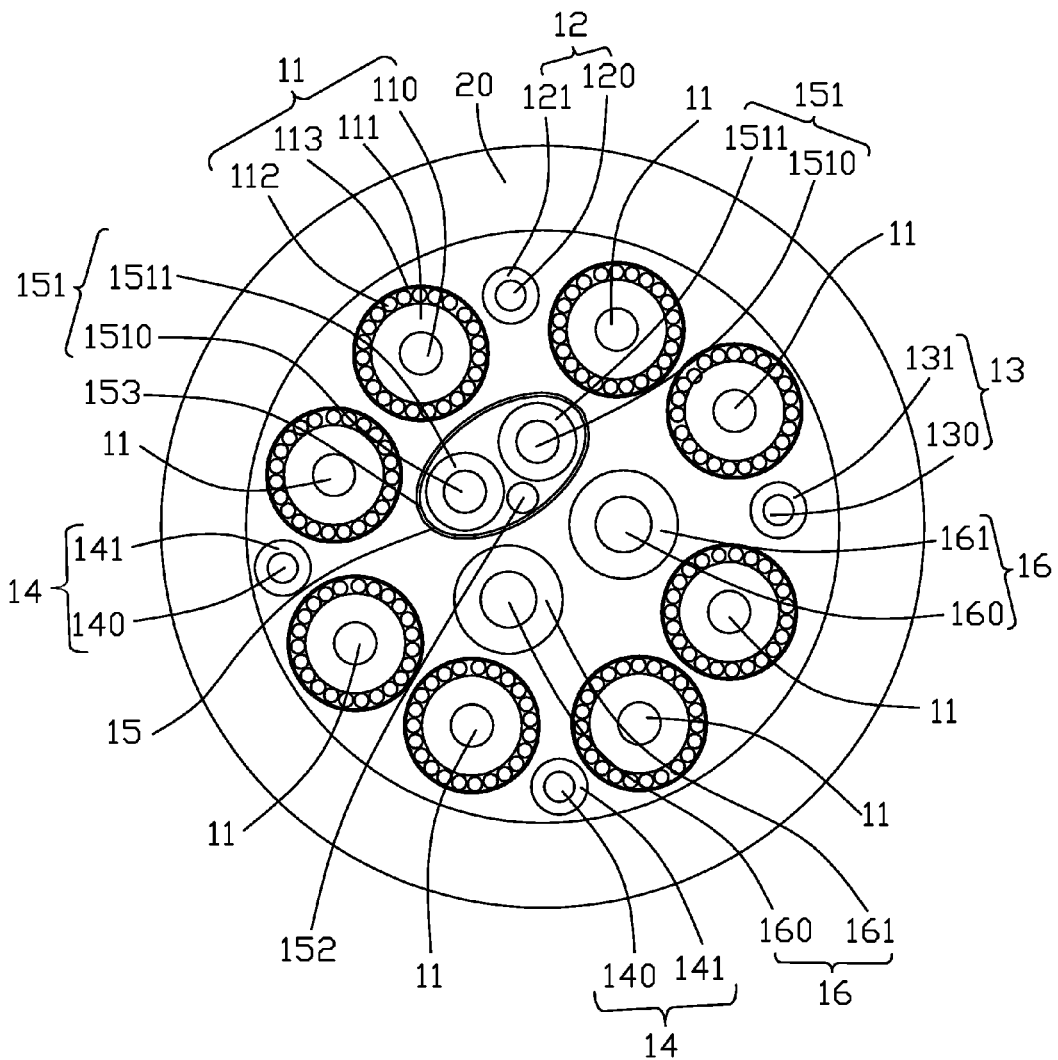
FIG. 2 is a cross-sectional view of the cable in FIG. 1.

Referring to FIGS. 1 and 2, a cable 100 comprises a plurality of wires 10 and a jacket 20 enclosing the wires 10. A shielding layer may be disposed between the wires 10 and the jacket 20. The cable 100 may implement USB Type-C standard.

The plurality of wires 10 comprise a plurality of differential signal wires 11 for transmitting high speed signals, a detection signal wire 12 for transmitting detection signal, a power wire 13 for supplying power to a cable end connector, a pair of auxiliary signal wires 14 for transmitting auxiliary signals, a plurality of low speed signal wires 15 for transmitting low speed signals, and at least two power wires 16 for transmitting power signals.

In this embodiment, there are four pairs of differential signal wires 11 for transmitting 10 Gbps USB 3.1 signals. All of the differential signal wires 11 are coaxial wires. Each of the differential signal wires 11 comprises a central conductor 110, an inner insulative layer 111 enclosing the central conductor 110, a shielding layer 112 enclosing the inner insulative layer 111, and an outer insulative layer 113 enclosing the shielding layer 112. The shielding layers 112 of each pair of differential signal wires reduce cross talk and coupling effect between the detection signal wire 12 and each of the auxiliary signal wires 14.

In this embodiment, the at least two power wires 16 have same diameters for transmitting large current 5 A, thereby realizing 100 W power supply. By increasing the shielding layer 112 from 40/0.05 mm construction to 36/0.06 mm construction, the increased cross-section and decreased impedance for power return meet the requirements of voltage drop 250 mV max for GND and temperature rise at 25° C. Adding one power wire while eliminating one ground wire, use of the shielding layers 112 avoids the disadvantage of a larger size cable. The diameter of the power wire 16 is larger than that of the power wire 13.

The plurality of differential signal wires 11, the detection signal wire 12, the power wire 13, and the auxiliary signal wires 14 are arranged at an outer periphery of and enclosing the low speed signal wires 15 and the at least two power wires 16. Every two adjacent pairs of differential signal wires 11 are separated by one of the detection signal wire 12, the power wire 13, and the auxiliary signal wires 13. The differential signal pairs increase distances between the detection signal wire 12, the power wire 13, and the auxiliary signal wire 14 while high frequency performance of the differential signal pairs is not adversely affected.

The low speed signal wires (USB D+/D−) 15 transmit USB 2.0 signals. The low speed signal wire 15 comprises a twisted pair 151, a grounding wire 152, and a shielding layer 153 enclosing the twisted pair 151 and the grounding wire 152, of a construction well known in this art. Each wire of the twisted pair 151 includes a conductor 1510 and an outer insulative layer 1511.

The auxiliary signal wire (SBU, Sideband Use) 14 may be used to transmit audio signal or other low speed signal. The auxiliary signal wire 14 includes an inner conductor 140 and an outer insulative layer 141 enclosing the inner conductor 140. The detection signal wire (CC, Configuration Channel) 12 includes an inner conductor 120 and an outer insulative layer 121 enclosing the inner conductor 120. The differential signal wire 11 has an outer diameter larger than a diameter of the detection signal wire 12 or a diameter of the auxiliary signal wire 14. In this embodiment, the central conductor 110 of the differential signal wire 11 is 32 AWG (American Wire Gauge). Each of the inner conductors 120, 140 of the detection signal wire 12 and the auxiliary signal wire 14 is 34 AWG.

The power wire (Vconn power) 13 is used to transmit power to an internal IC of a connector connected with the cable 100. The power wire 13 is optional. The power wire 13 includes an inner conductor 130 and an outer insulative layer 131 enclosing the inner conductor 130. In this embodiment, the inner conductor 130 of the power wire 13 is 34 AWG.

The power wire (Vbus power) 16 includes an inner conductor 160 and an outer insulative layer 161 enclosing the inner conductor 160. In this embodiment, the inner conductor 160 of the power wire 16 is 26 AWG.

The differential signal wires 11 are all coaxial wires. The wires 12, 13, 14, and 16 and the twisted pair 151 are all single insulated wires each having an inner conductor and an outer insulative layer. The grounding wire 152 is a bare conductor.

Figure 3:
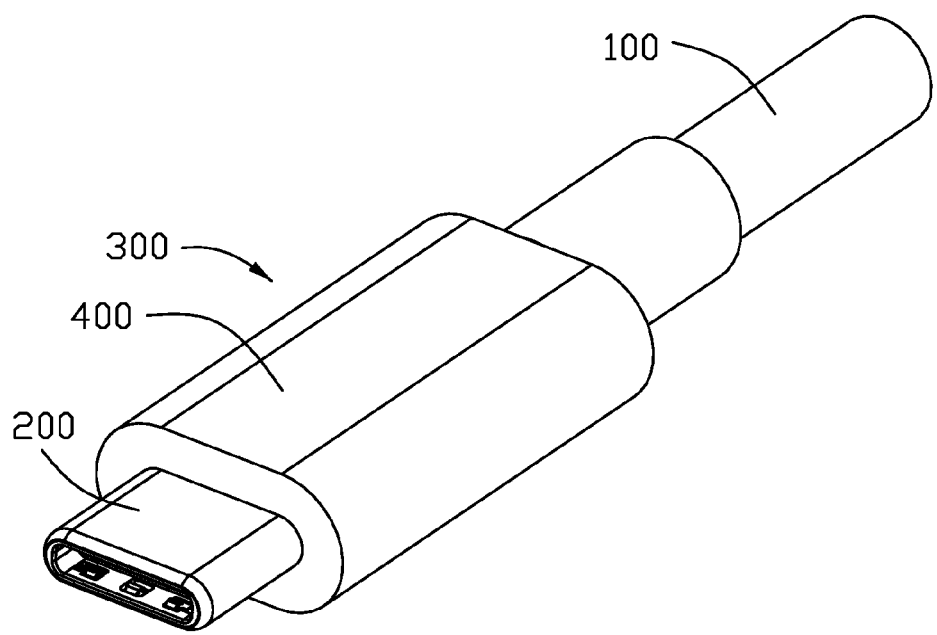
FIG. 3 is a perspective view of a cable connector assembly incorporating the cable in FIG. 1.
Figure 4:
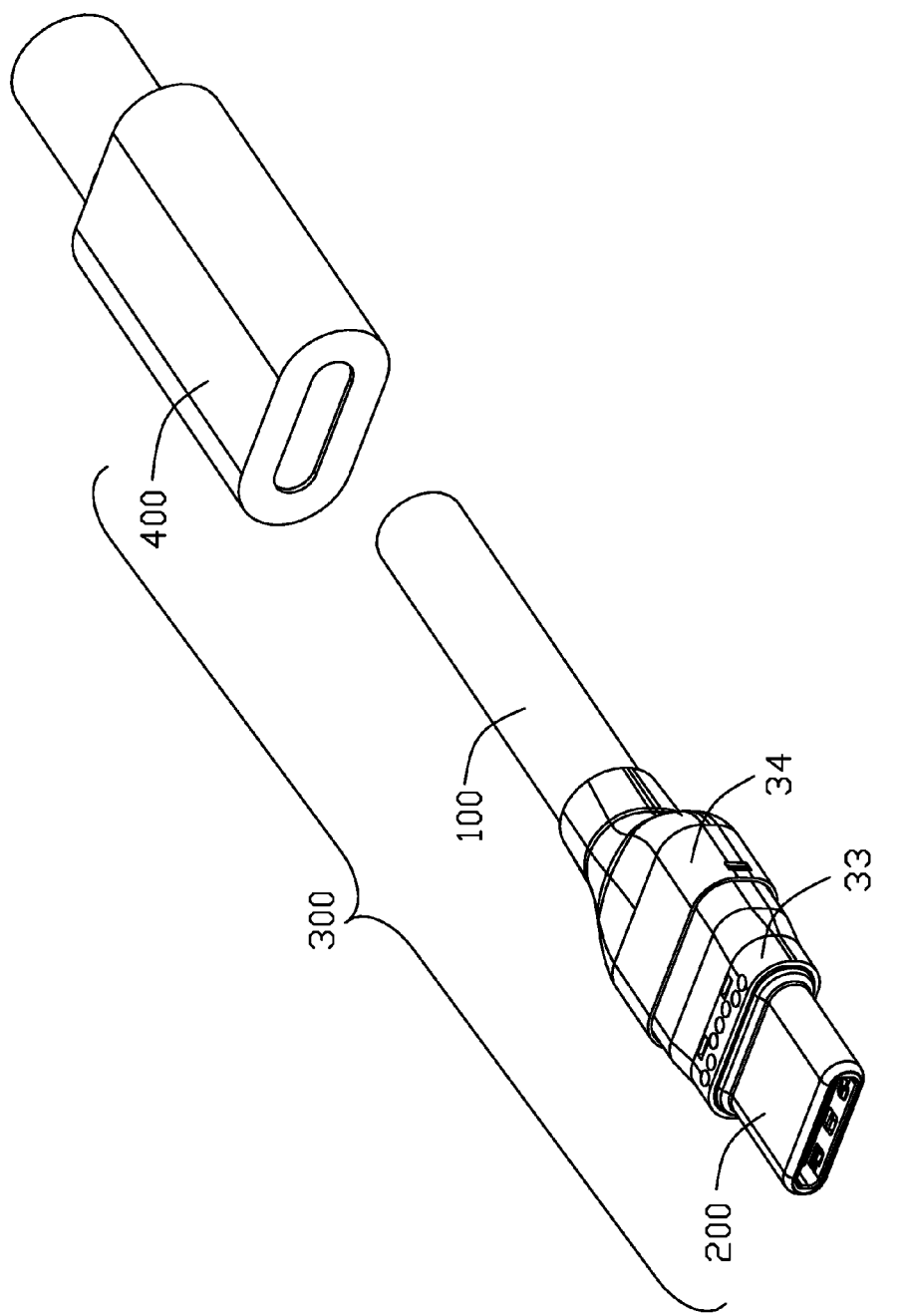
FIG. 4 is an exploded view of the cable connector assembly in FIG. 3.
Figure 5:
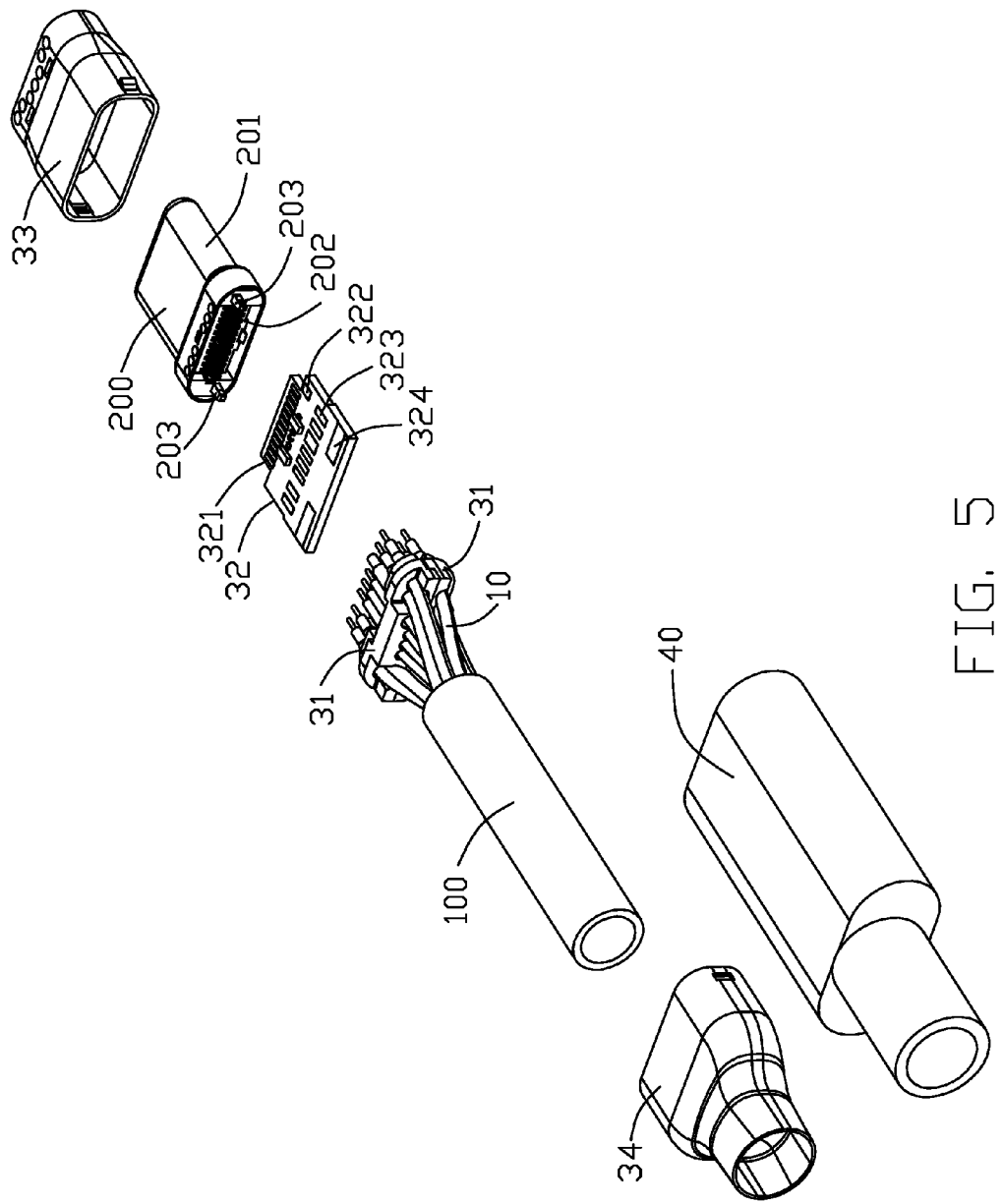
FIG. 5 is a further exploded view of the cable connector assembly in FIG. 4.
Figure 6:
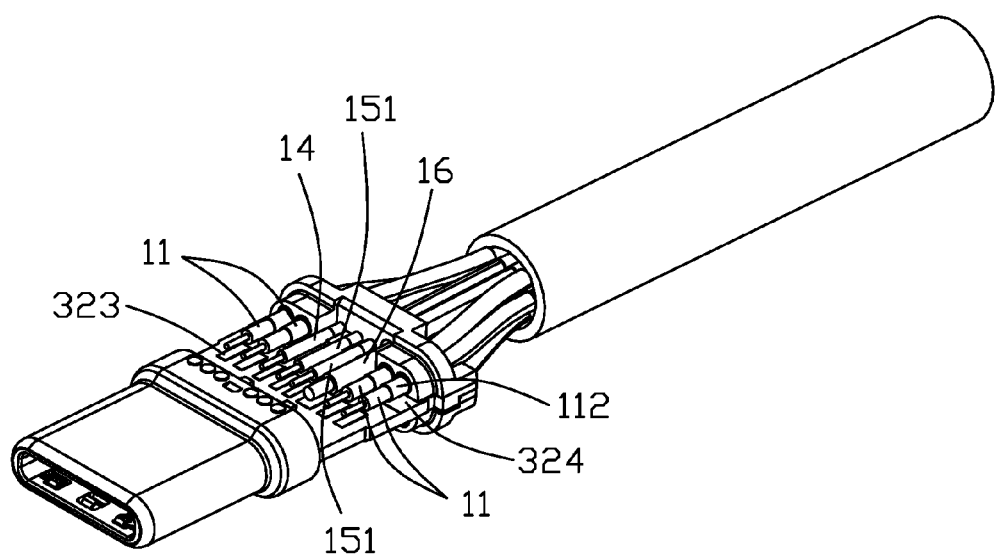
FIG. 6 is a view similar to FIG. 4, omitting a shielding shell and an outer over-mold of the cable connector assembly.
Figure 7:
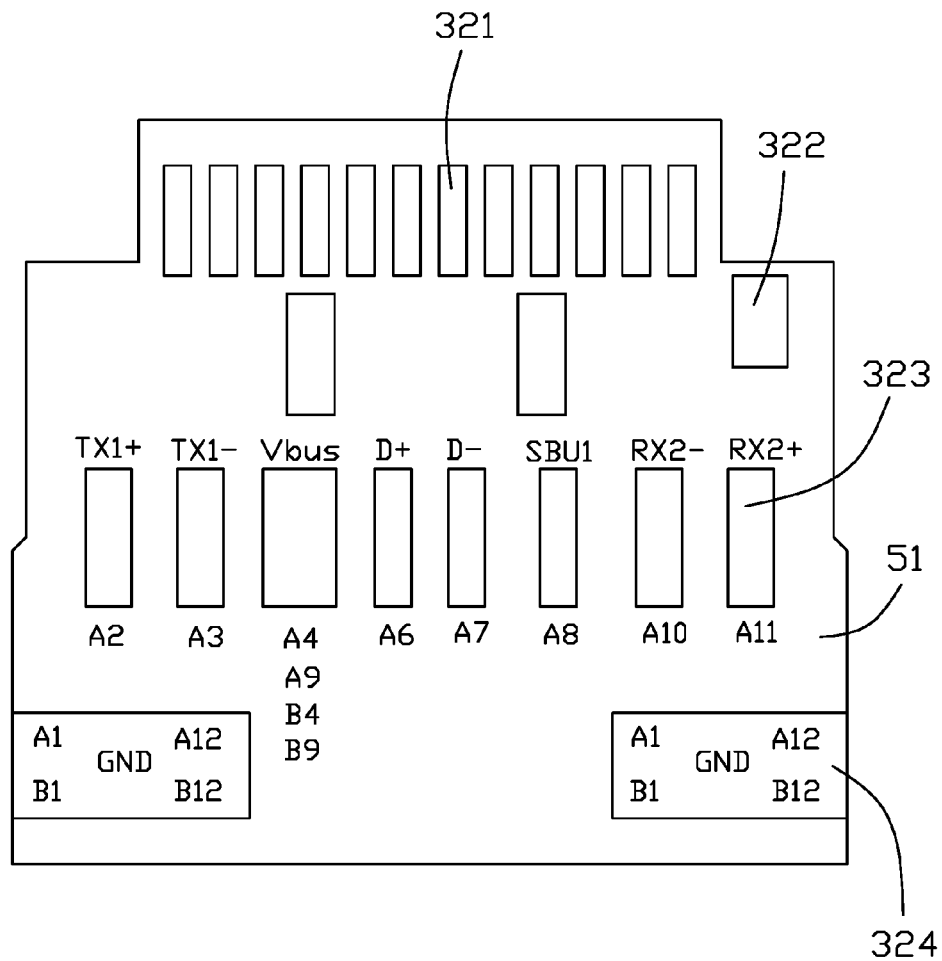
FIG. 7 is a schematic view of a printed circuit board of the cable connector assembly.
Figure 8:
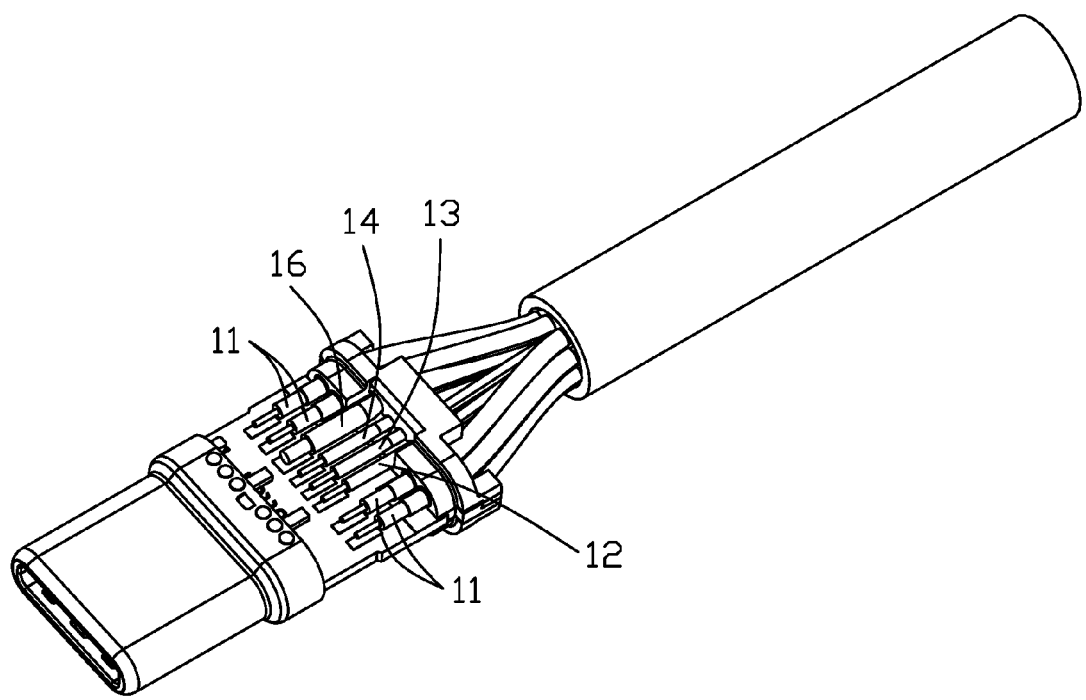
FIG. 8 is a view similar to FIG. 6 but from a different perspective.
Figure 9:
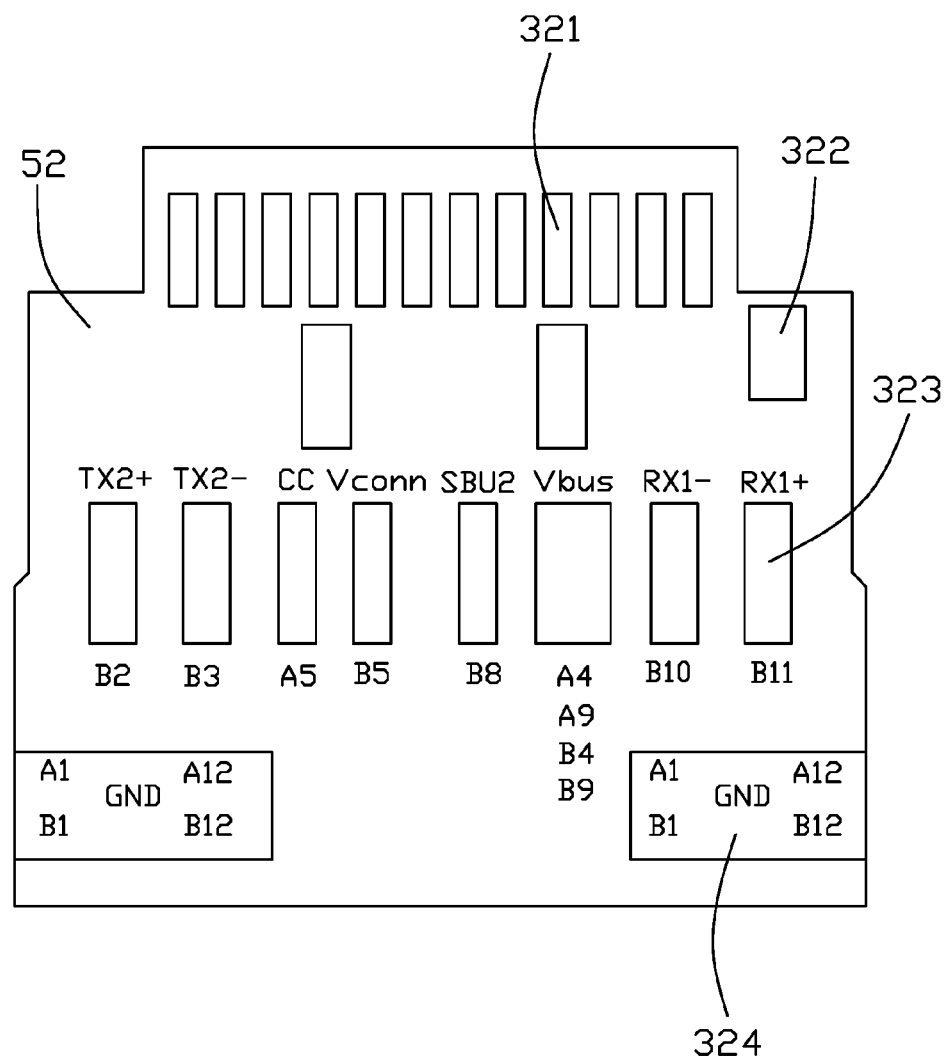
FIG. 9 is a schematic view of the printed circuit board in FIG. 7 from an opposite side.

FIG. 3 shows a cable connector assembly 300 incorporating the cable 100. The cable connector assembly 300 further comprises an electrical connector 200, an internal printed circuit board (PCB) 32, a front and rear shielding shells 33 and 34, a pair of wire spacers or organizers 31, and an outer over-mold 400. The electrical connector 200 includes a metal receptacle 201, an insulative housing carrying an upper and lower rows of contacts 202, and a pair of latches 203. Opposite upper and lower surfaces 51 and 52 of the PCB 32 each have a first, second, third, and fourth rows of conductive pads 321, 322, 323, and 324. The contacts 202 are soldered to the first conductive pads 321. The latches 203 are soldered to the second conductive pads 322. The conductors of the wires 10 are soldered to the third conductive pads 323. The fourth conductive pads 324 are to connect the shielding layers 112 of the differential signal wires 11 to ground.

As shown in FIGS. 6-9, the two power wires 16 are soldered to the PCB upper and lower surfaces 51 and 52, respectively. The third row of conductive pads 323 on the upper surface 51 are, in sequence from left to right, TX1+, TX1−, Vbus, D+, D−, SUB1, RX2−, and RX2+ and therefore soldered thereto are one differential signal wire 11, one further differential signal wire 11, one power wire 16, one wire of the twisted pair 151, the other wire of the twisted pair 151, one auxiliary signal wire 14, another differential signal wire 11, and one still further differential signal wire 11. Similarly, on the lower surface 52 having TX2+, TX2−, CC, Vconn, SUB2, Vbus, RX1−, and RX1+, one differential signal wire 11, one further differential signal wire 11, the detection signal wire 12, the power wire 13, the other auxiliary signal wire 14, the other power wire 16, another differential signal wire 11, and one still further differential signal wire 11 are soldered.

Disposition of respective eight wires on the upper and lower surfaces 51 and 52 is beneficial to a reduced size of the PCB 32. Disposition of the two wider power wires 16 on two opposite PCB surfaces results in an even distribution of wires 10. The two power wires 16 are able to transmit 5 A current and the shielding layers 112 are able to provide power return for the 5 A current.

What is claimed is:

1. A cable comprising:
a plurality of wires including a plurality of differential signal wires in pairs for transmitting high speed signal, a detection signal wire, at least one auxiliary signal wire, a plurality of low speed signal wires, and two power wires arranged adjacent to the low speed signal wires; and
a jacket enclosing the plurality of wires; wherein
the plurality of differential signal wires, the detection signal wire, and the at least one auxiliary signal wire are arranged at an outer periphery of and enclosing the low speed signal wires and the two power wires, and every two adjacent differential signal wire pairs are separated by one of the detection signal wire and the at least one auxiliary signal wire.

2. The cable as claimed in claim 1, wherein there are two auxiliary signal wires.

3. The cable as claimed in claim 1, wherein the plurality of wires comprise a power wire arranged at the outer peripheral and between two pairs of differential signal wires.

4. A cable connector assembly comprising:
a cable including a plurality of differential signal wires in pairs for transmitting high speed signal, a detection signal wire, at least one auxiliary signal wire, a plurality of low speed signal wires, and two power wires arranged adjacent to the low speed signal wires, wherein the plurality of differential signal wires, the detection signal wire, and the at least one auxiliary signal wire are arranged at an outer periphery of and enclosing the low speed signal wires and the two power wires;
an electrical connector; and
a printed circuit board (PCB) interconnected between the cable and the electrical connector; wherein
the two power wires are soldered to two opposite surfaces of the PCB, respectively.

5. The cable connector assembly as claimed in claim 4, wherein each of the detection signal wire and the at least one auxiliary signal wire separates two pairs of differential signal wires.

6. A cable connector assembly comprising:
a cable including a plurality of differential signal wires in pairs for transmitting high speed signal, a detection signal wire, at least one auxiliary signal wire, a plurality of low speed signal wires, and two power wires arranged adjacent to the low speed signal wires, wherein the plurality of differential signal wires, the detection signal wire, and the at least one auxiliary signal wire are arranged at an outer periphery of and enclosing the low speed signal wires and the two power wires;
an electrical connector; and
a printed circuit board (PCB) interconnected between the cable and the electrical connector and defining opposite two surfaces; wherein
on one of said two surfaces, a front row of pads are mechanically and electrically soldered with corresponding contacts of the electrical connector, a middle row of pads are soldered with the low speed signal wires and corresponding differential signal wires and one of the two power wires, and a rear row of pads soldered with a respective shielding layer of corresponding differential signal wires.

7. The cable connector assembly as claimed in claim 6, wherein said middle row of pads further are soldered to the at least one auxiliary signal wire.

8. The cable connector assembly as claimed in claim 6, wherein on the other of said two surfaces of the printed circuit board, another front row of pads are mechanically and electrically soldered with corresponding contacts of the electrical connector, another middle row of pads are soldered with corresponding differential signal wires, the other power wire and the detection signal wire, and another rear row of pads are soldered to a respective shielding layer of the corresponding differential signal wires.

9. The cable connector assembly as claimed in claim 8, wherein said another middle row of pads are further soldered with another auxiliary signal wire.

* * * * *